(12) United States Patent
Bhattacharyya

(10) Patent No.: US 7,553,735 B2
(45) Date of Patent: Jun. 30, 2009

(54) SCALABLE HIGH PERFORMANCE NON-VOLATILE MEMORY CELLS USING MULTI-MECHANISM CARRIER TRANSPORT

(75) Inventor: Arup Bhattacharyya, Essex Junction, VT (US)

(73) Assignee: Micron Technology, Inc., Boise, ID (US)

(*) Notice: Subject to any disclaimer, the term of this patent is extended or adjusted under 35 U.S.C. 154(b) by 42 days.

(21) Appl. No.: 11/821,627

(22) Filed: Jun. 25, 2007

(65) Prior Publication Data

US 2007/0247921 A1    Oct. 25, 2007

Related U.S. Application Data

(62) Division of application No. 11/066,900, filed on Feb. 25, 2005, now Pat. No. 7,244,981.

(51) Int. Cl.
  *H01L 21/20* (2006.01)
(52) U.S. Cl. ............... 438/381; 438/238; 257/E21.051; 257/E21.423; 257/E21.646
(58) Field of Classification Search ................ 438/238, 438/381, 149.311, 289, 263, 254, 506, 508
See application file for complete search history.

(56) References Cited

U.S. PATENT DOCUMENTS

| | | | |
|---|---|---|---|
| 4,870,470 A | 9/1989 | Bass, Jr. et al. | |
| 4,879,470 A | 11/1989 | Sugawa et al. | |
| 6,888,750 B2 | 5/2005 | Walker et al. | |
| 7,166,888 B2 * | 1/2007 | Bhattacharyya | 257/316 |
| 7,244,981 B2 * | 7/2007 | Bhattacharyya | 257/296 |
| 7,273,784 B2 * | 9/2007 | Bhattacharyya | 438/259 |
| 7,378,707 B2 * | 5/2008 | Bhattacharyya | 257/328 |
| 2004/0262667 A1 | 12/2004 | Bhattacharyya | |
| 2006/0110870 A1 | 5/2006 | Bhattacharyya | |
| 2006/0163644 A1 * | 7/2006 | Bhattacharyya | 257/316 |

OTHER PUBLICATIONS

H. Tomiye et al.; A novel 2-bit/cell MONOS memory device with a wrapped-control-gate structure that applies source-side hot-electron injection; Sony Corporation Semiconductor Network Company; 2002 Symposium on VLSI Technology Digest of Technical Papers; pp. 206-207.

J.Van Houdt et al.; A 5V/3.3V Flash $E^2$PROM cell with a 400ns/70µs programming time for embedded memory applications; IMEC Belgium; 1993 Nonvolatile Memory Technology Review; pp. 54-57.

* cited by examiner

*Primary Examiner*—David Nhu
(74) *Attorney, Agent, or Firm*—Leffert Jay & Polglaze, P.A.

(57) ABSTRACT

A plurality of select gates are formed over a substrate. In one embodiment, the select gates are formed vertically on the sidewalls of trenches. The substrate includes a plurality of diffusion regions that are each formed between a pair of planar select gates. In a vertical embodiment, the diffusion regions are formed at the bottom of the trenches and the tops of the mesas formed by the trenches. An enriched region is formed in the substrate adjacent to and substantially surrounding each diffusion region in the substrate. Each enriched region has a matching conductivity type with the substrate. A gate insulator stack is formed over the substrate and each of the plurality of select gates. A word line is formed over the gate insulator stack.

21 Claims, 6 Drawing Sheets

SCALABLE HIGH PERFORMANCE NON-VOLATILE MEMORY CELLS USING MULTI-MECHANISM CARRIER TRANSPORT

RELATED APPLICATIONS

This Application is a Divisional of U.S. application Ser. No. 11/066,900 filed on Feb. 25, 2005 (now U.S. Pat. No. 7,244,981 B2)titled "SCALABLE HIGH PERFORMANCE NON-VOLATILE MEMORY CELLS USING MULTI-MECHANISM CARRIER TRANSPORT," which is commonly assigned and incorporated herein by reference.

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), synchronous dynamic random access memory (SDRAM), dynamic random access memory (DRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

For code applications, a faster performing, less dense NOR cell is typically employed. For data storage applications, a slower performing, denser NAND cell configuration is typically employed.

As computers become smaller and their performance increases, the computer memories have also gone through a corresponding size reduction and performance increase. However, flash memory devices present a challenge in scalability due, at least in part, to the high programming voltages typically required. Additionally, even a NOR or NROM configuration of flash or other non-volatile cell programs (writing and erasing) considerably slower than DRAM and have limited endurance (write/erase cycle capability) when compared to DRAM.

For the reasons stated above, and for other reasons stated below which will become apparent to those skilled in the art upon reading and understanding the present specification, there is a need in the art for a more scalable, higher performance, high density, and higher endurance non-volatile memory device that can bridge the application gap between DRAM and non-volatile memory devices.

DETAILED DESCRIPTION

Figure 1:
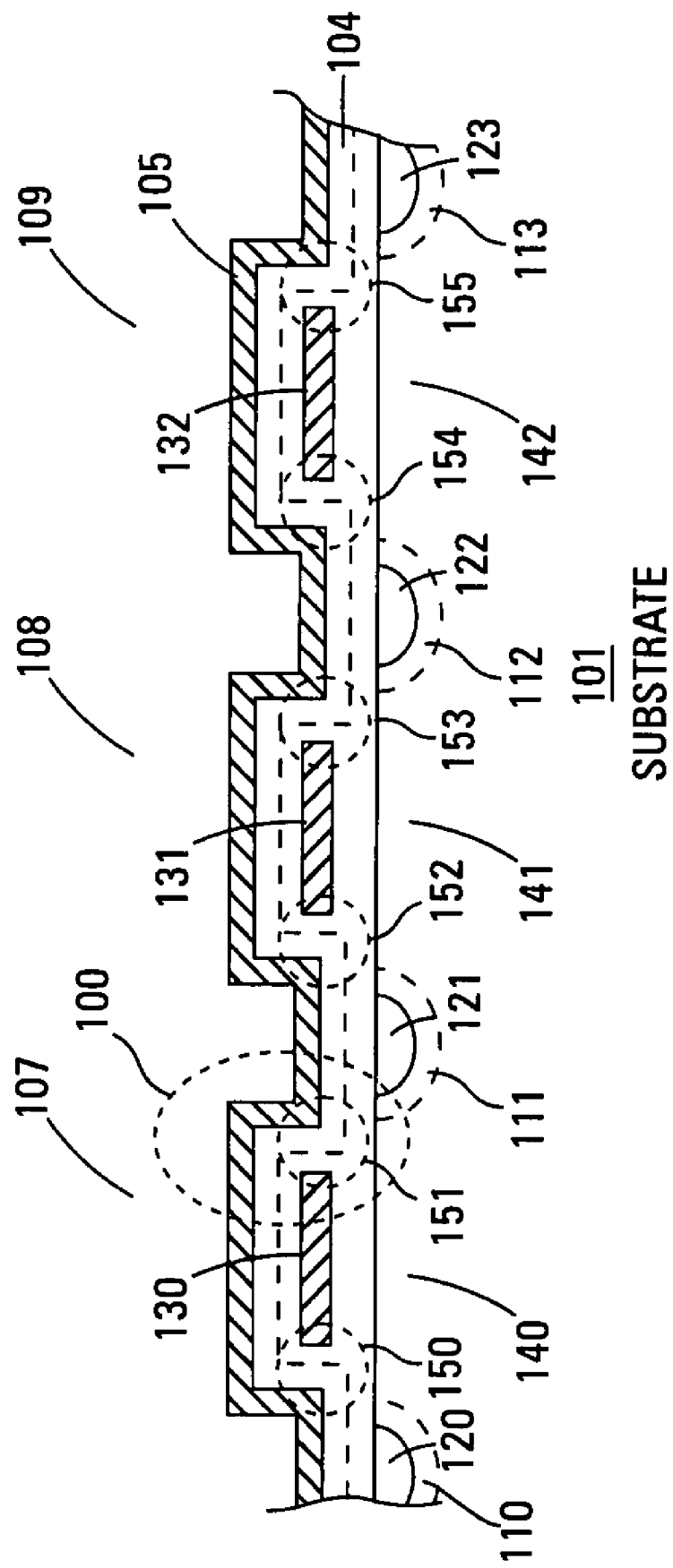
FIG. 1 shows a cross-sectional view of one embodiment of a planar non-volatile memory device using multi-mechanism carrier transport of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

The embodiments of memory device of the present invention utilize two simultaneous high speed yet highly efficient mechanisms for both programming and erasing. The device uses a scaled embedded trap field effect transistor (FET) wherein a thin, deep energy trapping layer holds electrons during the programming operation (i.e., the high $V_t$ state) and holds holes during the erase operation (i.e., the low $V_t$ state). Each FET is comprised of a fixed threshold select gate with offset diffusions as source lines and bit lines. The memory gate with the underlying insulator stack wraps around the select gate.

The transport of electrons to the trapping layer is achieved simultaneously by source side injection of hot electrons and direct tunneling of cooler electrons from the substrate. This results in faster and more energy efficient operations. In one embodiment, the programming operation can be accomplished in less than 100 ns and the erase operation performed in less than 1 microsecond.

During the erase operation, two mechanisms are simultaneously used. Hot holes are injected upward to the trapping layer due to the high field at the diffusion-substrate depletion layer during erasing and simultaneously cooler holes are injected from the gate electrode downward to the trapping layer by enhanced field emission by selecting an appropriate electrode-insulator combination.

The FET's of the present invention can be implemented in both planar and three-dimensional architectures as discussed in the subsequent figures. The three dimensional embodiment has the added benefits of providing a contact-less, virtual ground array for high bit density configurations.

FIG. 1 illustrates a cross-sectional view of one embodiment of the planar non-volatile memory device using multi-mechanism carrier transport of the present invention. For purposes of clarity, this figure shows only a small portion of the memory array.

The cells 107-109 are fabricated on a substrate 101. In one embodiment, the substrate 101 is a p-type silicon. In an alternate embodiment, the substrate 101 is an n+ type silicon.

Doped diffusion areas 120-123 are created in the substrate 101. If the substrate is a p-type material, the diffusion areas 120-123 are n+ conductivity. However, an alternate embodiment could use an n-type substrate thus requiring heavily doped p-type diffusion areas 120-123. The diffusion areas 120-123 act as source lines and bit lines, depending on the direction of operation of the memory string.

Each of the n+ diffusion areas 120-123 are substantially surrounded in the substrate 101 by a "p-halo" 110-113, respectively. The "p-halo", in one embodiment, is a boron-halo implant (i.e., an enriched p region) that enables efficient hole injection at the erase voltage condition. If the substrate is an n-type substrate, the halo region would be an enriched "n-halo" region.

Channel regions 140-142 are formed in the substrate 101 between each source line/bit line pair of diffusion areas 120-123. These are the regions 140-142 in which the channels form, as is well known in the art, during operation of the memory cells. For example, one channel forms in a first channel region 140 between a first source line 120 and a first bit line 121. A second channel forms in a second channel region 141 between a second source line 122 and the first bit line 121. A third channel forms in a third channel region 142 between the second source line 122 and a second bit line 123.

A select gate 130-132 is formed over the substrate. In one embodiment, the select gate 130-132 is separated from the substrate by an insulator such as an oxide material. The select gate 130-132 can be formed from a heavily doped polysilicon to provide channel control between each pair of the diffusion pockets 120-123.

A program gate 105, which is also the word line, wraps around each select gate 130-132 of cell 107-109. The program gate 105, in one embodiment, is formed from a polysilicon and is separated from the select gates 130-132 and the substrate 101 by a gate insulator stack 104. The gate insulator stack 104, having a trapping layer, is illustrated in greater detail in FIG. 2 that is discussed subsequently.

At least two high-speed transport mechanisms are operative substantially simultaneously for both programming and erasing. During a program operation, a high field at the select gate edge 150-155 injects hot electrons similar to the source side injection while cooler electrons are injected into the trapping layer of the gate insulator stack by direct tunneling.

During an erase operation, hot holes are injected into the trapping layer from the silicon substrate by band-to-band tunneling and simultaneously from the top electrode by enhanced field emission. The top electrode is held at a positive potential with respect to the source line.

Each memory cell of the present invention is capable of storing at least two data bits. Each cell 107-109 has two storage regions 150-155 located in the gate insulator stack that is illustrated in greater detail with reference to FIG. 2. These areas are located substantially adjacent to the edges of the select gates 130-132 and are generated in response to the high electric fields generated at each select gate edge.

The non-volatile memory cell string is operated in either direction in order to store data in each storage region 150-155. For example, in one embodiment, if the left most diffusion area 120 is biased as a drain area and the right diffusion area 123 as the source areas, a first storage region 151, 153, and 155 of each cell 107-109 is used. If the string is biased in the opposite direction such that the left most diffusion area 120 is a source area, the remaining storage regions 150, 152, and 154 are used.

While the above-described embodiment is discussed as a NAND array. The present invention is not limited to such an architecture. Alternate embodiments of the present invention can be used in NOR arrays, AND arrays, direct tunnel memory for DRAM devices, virtual gate arrays, and other types of memory architectures.

Figure 2:
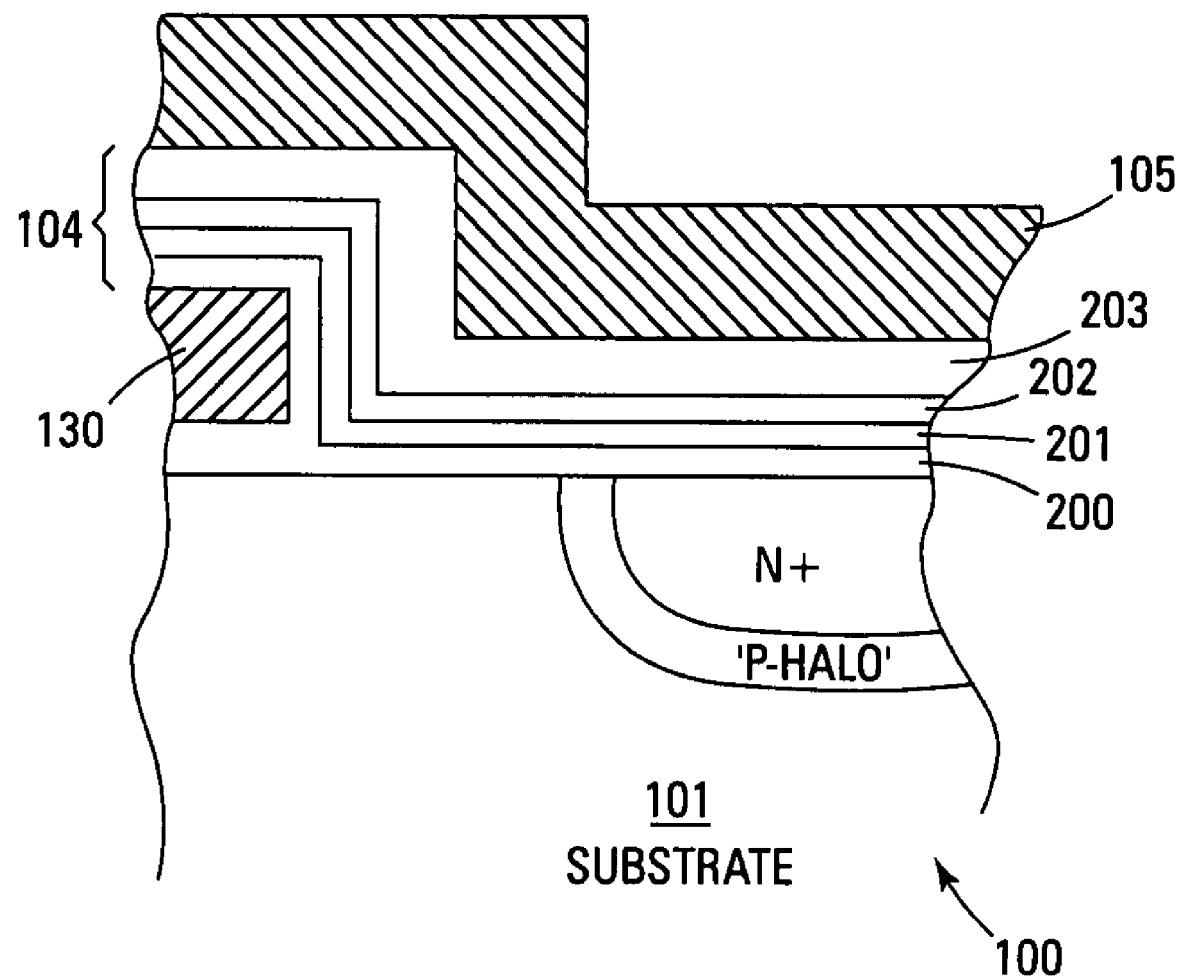
FIG. 2 shows a more detailed cross-sectional view of one embodiment of a scaled gate insulator stack for the non-volatile memory device of FIG. 1.

FIG. 2 illustrates a detailed cross-sectional view 100 of one embodiment of a gate insulator stack 104 for a non-volatile memory cell of the present invention, as discussed above with reference to FIG. 1. This architecture employs an embedded trapping layer for storing a charge and is formed between the program gate 105, substrate 101, and select gate 130 of FIG. 1.

The stack 100 is comprised of a tunnel insulator 200 that can be an oxide material, an oxygen-rich oxynitride material (refractive index=1.55), or some other type of insulator. In one embodiment, the tunnel insulator layer 200 is approximately 15 Å thick.

A deep energy trapping layer 201 is formed over the tunnel insulator 200. In one embodiment, the trapping layer 201 is comprised of an oxynitride material (refractive index=1.7-1.8) or some other charge retention material and is approximately 40 Å thick. This layer 201 confines the stored electrons or holes.

A charge blocking dielectric layer 202 is formed over the trapping layer 201. This layer 202 minimizes the programming voltage and field across the dielectric stack. The dielectric 202 is a high dielectric constant material such as Hafnia ($HfO_2$) with a K=25, Alumina ($Al_2O_3$) with a K=10, Zirconia ($ZrO_2$) with a K=20, Praeseodymium Oxide ($Pr_2O_3$) with a K=30, or some other high-K dielectric material. In one embodiment, this layer 202 is formed to a thickness of approximately 60 Å.

An overlay coating of approximately 40 Å of injector silicon-rich nitride material 203 is formed over the charge blocking layer 202. This layer 203 acts as a passivation layer for process integration as well as a carrier injection layer to enhance field emission carriers.

The above-described gate insulator stack 104, in one embodiment, has an effective oxide thickness (EOT) of approximately 50 Å (5 nm) for a physical thickness in the range of 11.7 to 15.5 nm. The present invention is not limited to any one material or thickness for any of the materials of the insulator stack 104.

Figure 3:
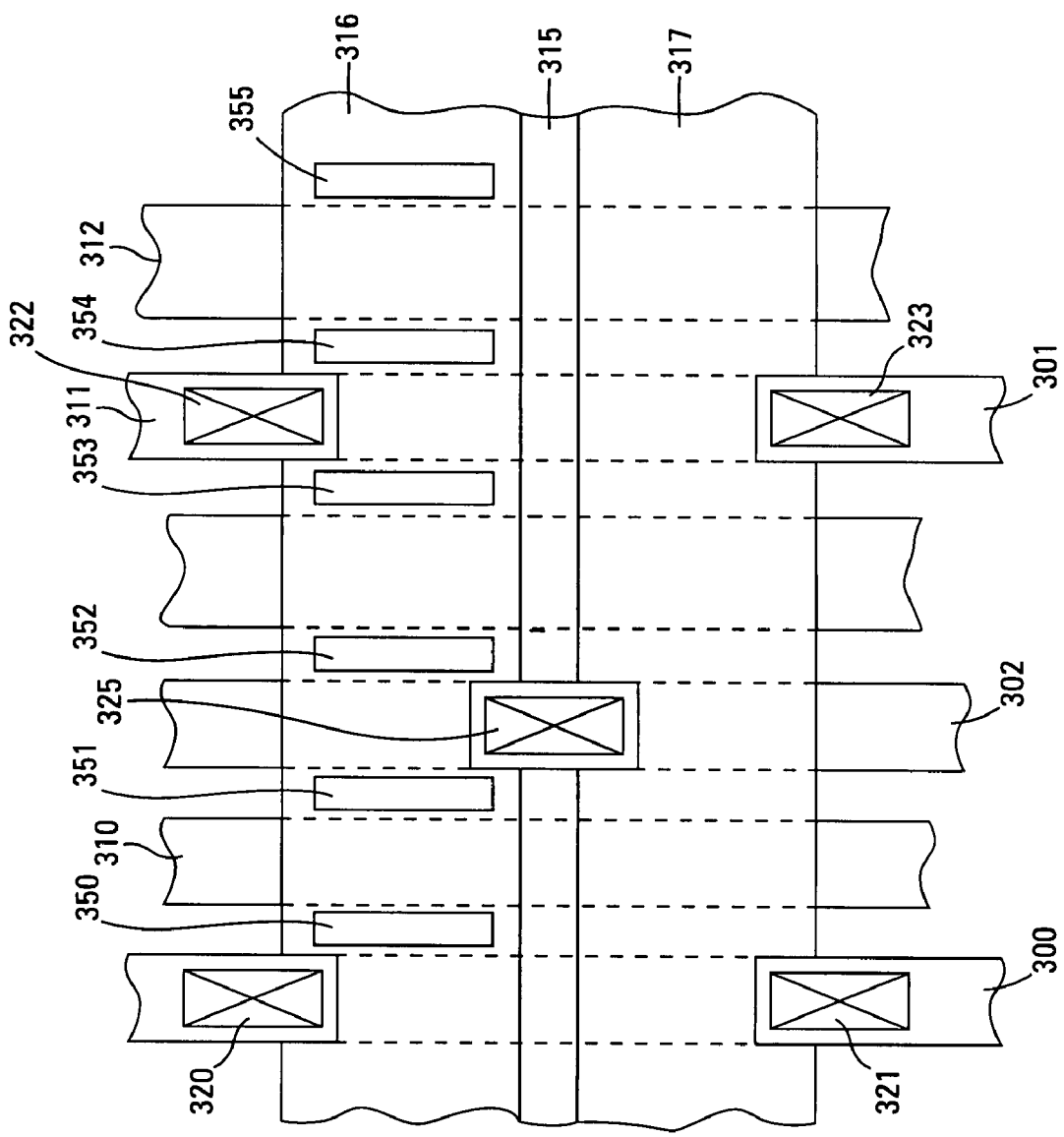
FIG. 3 shows a top layout view of the memory array in accordance with the embodiment of FIG. 1.

FIG. 3 illustrates a top layout view of the memory array in accordance with the planar embodiment of FIG. 1. This view shows two of the word lines 316, 317 that extend over each cell through one row of the memory array. The word lines are notched around the source and bit line contacts 320-323, 325 so that source/bit line contacts are made only at the non-active regions between the word lines 316, 317.

An isolation region 315 runs between pairs of word lines 316, 317. In one embodiment, the isolation regions 315 are an oxide insulator. For purposes of clarity, only two word lines 316, 317 and one separating isolation line 315 are shown. It is well known in the art that a memory device can be comprised of thousands of millions of word lines, each pair separated by an isolation region.

The source lines 300, 301 and the bit lines 302 run substantially perpendicular to the word lines 316, 317. The source lines 300, 301 and the bit lines 302 can be contacted 320-323, 325 respectively by a metal layer in order to provide the proper biasing to the cells for desired operations. The select gates 310-312 run substantially parallel to the source and bit lines 300-302.

The two bit/cell trapping areas 350-355 are located adjacent to and on either side of the select gates 310-312. For purposes of clarity, only one word line 316 is illustrated with the trapping areas 350-355. However, each wordline 316, 317 of the array will have the trapping areas in substantially similar locations with reference to the select gates 310-312 (not shown for word line 317).

Figure 4:
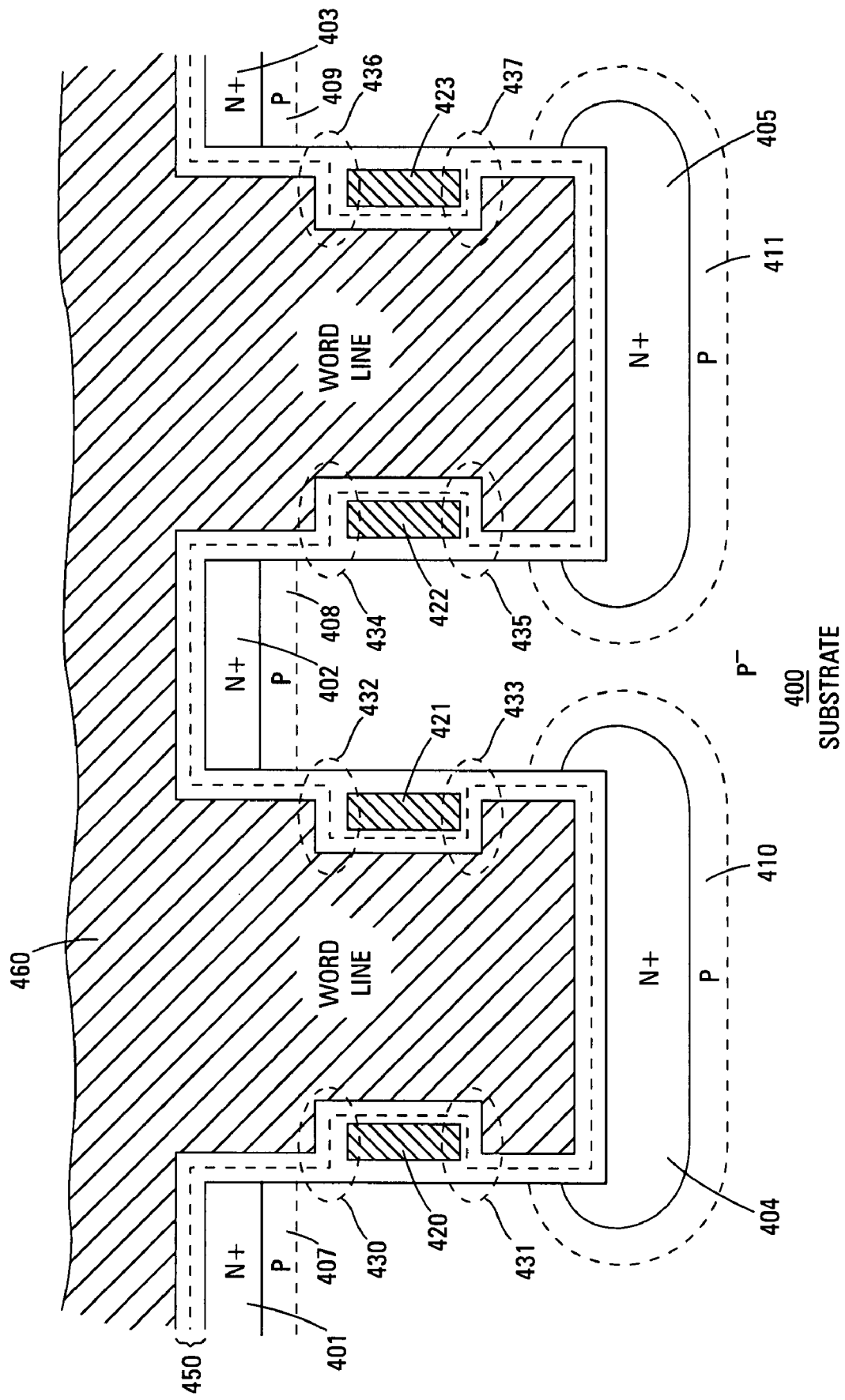
FIG. 4 shows a cross-sectional view of one embodiment of a three dimensional, non-volatile memory device using multi-mechanism carrier transport of the present invention.

FIG. 4 illustrates a cross-sectional view of one embodiment of a three dimensional, non-volatile memory device using the multi-mechanism carrier transport of the present invention. This embodiment uses a substantially similar gate insulator stack as that illustrated in FIG. 2. However, this embodiment, provides substantially greater density than the planar embodiment due to the vertical orientation of the memory and fixed threshold elements.

The array of FIG. 4 is comprised of a plurality of trenches formed in the substrate 400. Each pair of trenches defines a mesa. Each trench comprises two memory cells that each is capable of storing two bits. Therefore, each trench is capable of storing four bits.

Diffusion areas 401-403 are formed in the tops of the mesas. Additional diffusion areas 404, 405 are formed under the trenches. The "p-halo" areas 407-411 are formed under the mesa diffusion areas 401-403 and around the trench diffusion areas 404-405. The diffusion areas 401-405 and "p-halo" areas 407-411 have the same function as discussed in the previous embodiment of FIG. 1.

In one embodiment, the substrate 400 is a p-type substrate with n+ diffusion areas 401-411. An alternate embodiment can use an n-type substrate with p-type diffusion areas.

The gate insulator stack 450 is formed along the outline of the trenches and mesas. This stack is substantially similar to that discussed in the embodiment of FIG. 2. As in the embodiment of FIG. 1, the insulator stack 450 also extends over the select gates 420-423 that are formed in each trench.

A word line 460 is formed over the mesas and into the trenches. The wordline is formed over the gate insulator stack 450.

The charge storage areas 430-437 are located in the gate insulator stack 450 substantially adjacent to the edges of each of the select gates 420-423. As in the previous embodiment, these areas are formed in response to the high electric fields generated at each select gate edge.

Figure 5:
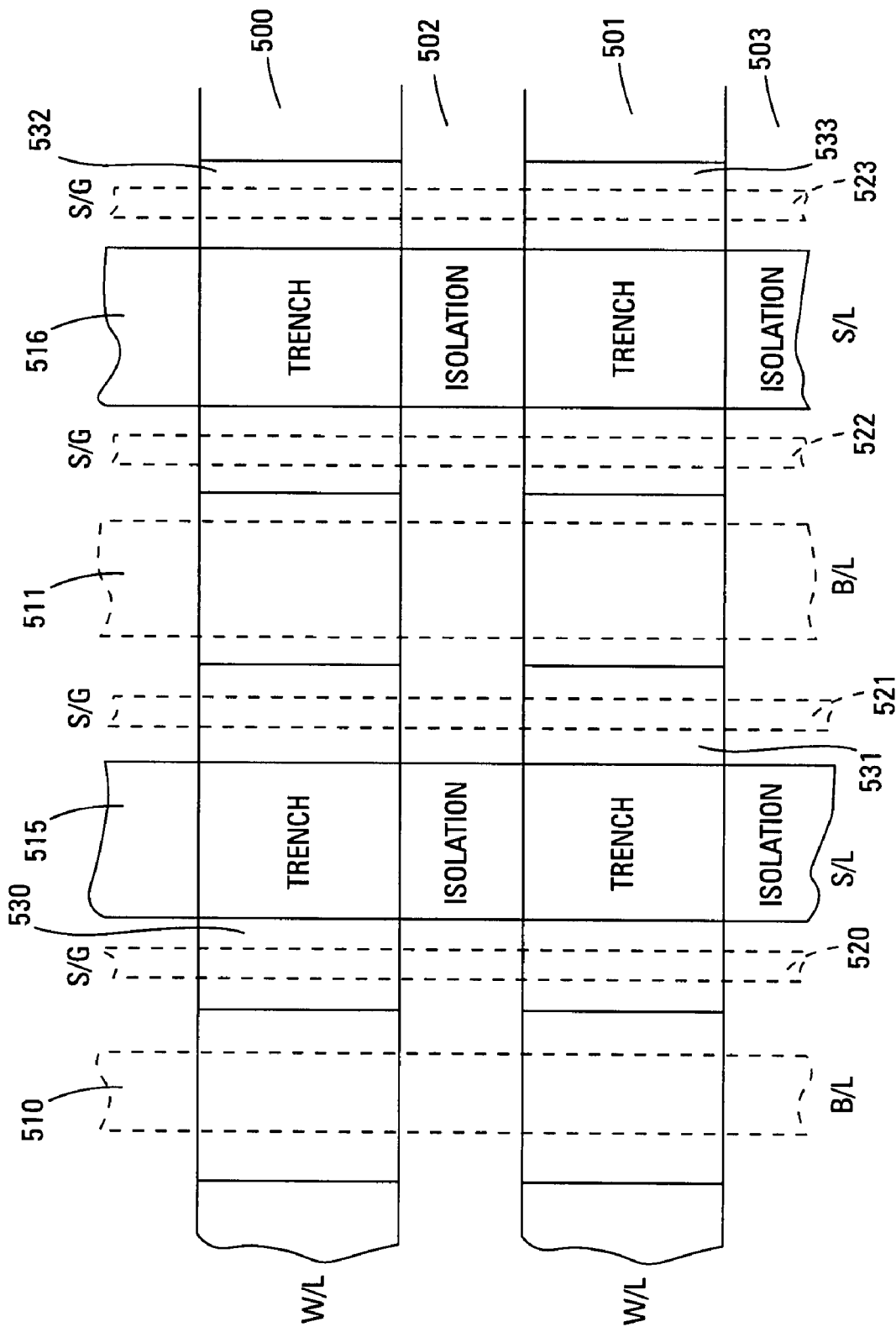
FIG. 5 shows a top layout view of the memory array in accordance with the embodiment of FIG. 4.

FIG. 5 illustrates a top layout view of the memory array of the embodiment of FIG. 4. This embodiment is comprised of the word lines 500, 501 that are separated by an isolation region 502, 503. For purposes of clarity only two word lines 500, 501 and one isolation region 502, 503 are shown. It is well known in the art that a memory array can be comprised of thousands or millions of word lines, each pair separated by an isolation region.

The select gates 520-523 are formed substantially perpendicular to the word lines 500, 501. The bit lines 510, 511 and source lines 515, 516 are formed substantially parallel to the select gates 520-523. The trenches 530-533 of this embodiment are also shown underneath the word lines 500, 501. A deep buried n+ ion implant links the buried n+ pockets below the trench regions 530-533 to form a continuous n+ source line.

One embodiment of operational voltages is illustrated in the following table. These voltages are for purposes of illustration only as the present invention is not limited to any predetermined biasing.

|  | Source Line | Bit Line | Select Gate | Program Gate | Vt(PG) |
| --- | --- | --- | --- | --- | --- |
| WRITE | +3.5 V | 0 V | 1.0/0 V | +4.5 V | +2.0 V |
| ERASE | +4.5 V | 0 V | +3.5 V | +1.0 V | −1.5 V |
| READ | 0 V | 1.5 V | +1.0 V | +0.5 V | |

Figure 6:
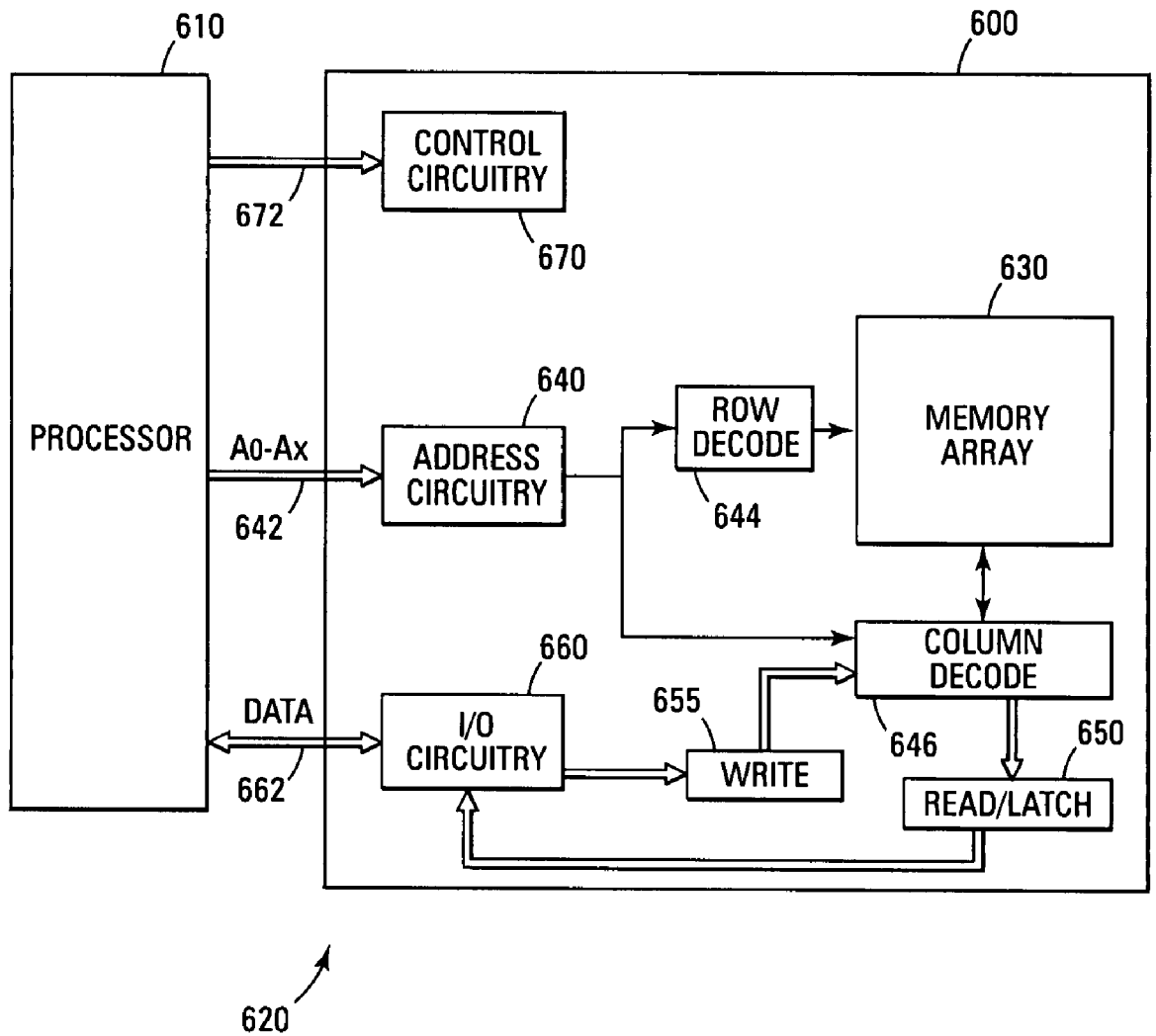
FIG. 6 shows a block diagram of one embodiment of an electronic system of the present invention.

FIG. 6 illustrates a functional block diagram of a memory device 600 that can incorporate the non-volatile memory cells of the present invention. The memory device 600 is coupled to a processor 610. The processor 610 may be a microprocessor or some other type of controlling circuitry. The memory device 600 and the processor 610 form part of an electronic system 620. The memory device 600 has been simplified to focus on features of the memory that are helpful in understanding the present invention.

The memory device includes an array of memory cells 630 that can be comprised of the embodiments of the non-volatile memory cells that were previously illustrated. The memory array 630 is arranged in banks of rows and columns as illustrated in FIG. 5. The gates of each row of memory cells are coupled with a word line while the drain and source connections of the memory cells are coupled to bit lines.

An address buffer circuit 640 is provided to latch address signals provided on address input connections A0-Ax 642. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense/buffer circuitry 650. The sense/buffer circuitry, in one embodiment, is coupled to read and latch a row of data from the memory array 630. Data input and output buffer circuitry 660 is included for bi-directional data communication over a plurality of data connections 662 with the controller 610. Write circuitry 655 is provided to write data to the memory array.

Control circuitry 670 decodes signals provided on control connections 672 from the processor 610. These signals are used to control the operations on the memory array 630, including data read, data write (program), and erase operations. The control circuitry 670 may be a state machine, a sequencer, or some other type of controller.

The memory device illustrated in FIG. 6 has been simplified to facilitate a basic understanding of the features of the memory. A more detailed understanding of internal circuitry and functions of memories are known to those skilled in the art.

CONCLUSION

The embodiments of the present invention provide a scalable non-volatile device that can be programmed simultaneously by both direct tunneling of "cool" electrons as well as efficient source side "hot" electrons. The device erases simultaneously by injection of "hot" holes from the substrate as well as "cooler" holes from a top electrode by enhanced field emission. This results in a significant enhancement of program and erase speeds at relatively low voltages, thus improving scalability and endurance.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a non-volatile memory device having a plurality of select gates formed over a substrate, a gate insulator stack having a trapping layer and formed over the plurality of select gates and the substrate, and a wordline formed over the gate insulator stack, the substrate comprising a plurality of diffusion areas, each select gate surrounded by a pair of diffusion areas, the method comprising:
biasing the diffusion areas such that a pair of diffusion areas surrounding a first select gate is biased as a drain region and a source region;
biasing the first select gate to create an electric field at one edge of the first select gate;
and
biasing the word line such that the select gate injects hot electrons into the trapping layer substantially simultaneously with cool electrons being injected into the trapping layer by direct tunneling.

2. The method for programming a non-volatile memory device of claim 1 wherein a first diffusion area of the pair of diffusion areas is a bit line and a second diffusion area of the pair of diffusion areas is a source line.

3. The method for programming a non-volatile memory device of claim 2 wherein the bit line is biased at a lower voltage than the source line.

4. The method for programming a non-volatile memory device of claim 3 wherein the bit line is biased at 0V and the source line is biased at 3.5 V during a programming operation.

5. A method for erasing a non-volatile memory device having a plurality of select gates formed over a substrate, a gate insulator stack having a trapping layer and formed over the plurality of select gates and the substrate, and a wordline formed over the gate insulator stack, the substrate comprising a plurality of diffusion areas, each select gate surrounded by a pair of diffusion areas, the method comprising:
biasing the diffusion areas such that a pair of diffusion areas surrounding a first select gate is biased as a drain region and a source region;
biasing the first select gate to create an electric field at one edge of the first select gate; and
biasing the word line such that the substrate injects hot holes into the trapping layer substantially simultaneously with cooler holes being injected into the trapping layer from the word line.

6. The method for erasing a non-volatile memory device of claim 5 wherein the substrate injects hot holes using band-to-band tunneling and the word line injects cooler holes using enhanced field emission.

7. The method for erasing a non-volatile memory device of claim 5 wherein a first diffusion area of the pair of diffusion areas is a bit line and a second diffusion area of the pair of diffusion areas is a source line.

8. The method for erasing a non-volatile memory device of claim 7 wherein the bit line is biased at a lower voltage than the source line during an erase operation.

9. The method for erasing a non-volatile memory device of claim 8 wherein the bit line is biased at 0V and the source line is biased at 4.5 V during an erase operation.

10. A method for fabricating a memory device, the method comprising:
forming a plurality of select gates over a substrate;
forming a plurality of diffusion regions in the substrate, each diffusion region formed between a pair of select gates;
forming an enriched region in the substrate adjacent to and substantially surrounding each diffusion region in the substrate;
forming a gate insulator stack over the substrate and the plurality of select gates; and
forming a word line structure over the gate insulator stack.

11. The method for fabricating a memory device of claim 10 wherein forming the gate insulator stack comprises:
forming an oxygen-rich tunnel insulator over the substrate and select gates;
forming an oxynitride trapping layer over the tunnel insulator;
forming a charge blocking layer over the trapping layer; and
forming an injector silicon rich nitride layer over the charge blocking layer.

12. The method for fabricating a memory device of claim 11 wherein the injector silicon rich nitride layer comprises a passivation layer for the method for fabricating.

13. The method for fabricating a memory device of claim 10 wherein the method further comprises fabricating the memory device as a vertical memory device.

14. The method for fabricating a memory device of claim 10 wherein the method further comprises fabricating the memory device as a planer memory device.

15. The method for fabricating a memory device of claim 11 wherein the charge blocking layer is formed from a material taken from a list of materials, the list comprising: $HfO_2$, $Al_2O_3$, $ZrO_2$ and $Pr_2O_3$.

16. The method for fabricating a memory device of claim 10 wherein the substrate and the enriched region are of the same type of material.

17. The method for fabricating a memory device of claim 10 wherein the enriched region comprises a halo region.

18. The method for fabricating a memory device of claim 17 wherein the substrate is an p-type substrate and the enriched region is an p-halo region.

19. The method for fabricating a memory device of claim 18 wherein the p-halo region is a boron halo implant region.

20. The method for fabricating a memory device of claim 11 wherein the oxynitride trapping layer stores accumulated hot and cooler holes as a result of performing an erase operation.

21. The method for fabricating a memory device of claim 11 wherein the oxynitride trapping layer stores accumulated hot and cool electrons as a result of performing a programming operation.

* * * * *